(12) United States Patent
Li et al.

(10) Patent No.: US 6,342,705 B1
(45) Date of Patent: Jan. 29, 2002

(54) SYSTEM FOR LOCATING AND MEASURING AN INDEX MARK ON AN EDGE OF A WAFER

(75) Inventors: Kenneth J. Li, Rochester; Donald P. McClimans, Fairport, both of NY (US)

(73) Assignee: Chapman Instruments, Rochester, NY (US)

( * ) Notice: Subject to any disclaimer, the term of this patent is extended or adjusted under 35 U.S.C. 154(b) by 0 days.

(21) Appl. No.: 09/394,552

(22) Filed: Sep. 10, 1999

(51) Int. Cl.[7] ................................................ G01N 21/86
(52) U.S. Cl. .............................. 250/559.4; 250/559.22; 356/400; 356/602
(58) Field of Search ....................... 250/559.4, 559.44, 250/559.42, 559.36, 559.22, 559.23, 559.2, 559.19, 548, 559.24; 356/237.4, 237.6, 602, 400, 401, 237.1

(56) References Cited

U.S. PATENT DOCUMENTS

| | | | |
|---|---|---|---|
| 4,877,970 A | 10/1989 | Minamikawa | 250/559.14 |
| 4,982,103 A | 1/1991 | Meiffren | 250/559.13 |
| 5,159,202 A | * 10/1992 | Ametani | 250/559.22 |
| 5,369,490 A | 11/1994 | Kawai | 356/601 |
| 5,438,209 A | * 8/1995 | Yamamoto et al. | 250/559.29 |
| 5,546,179 A | 8/1996 | Cheng | 356/73 |
| 5,684,599 A | * 11/1997 | Shimoyama et al. | 356/400 |
| 5,691,543 A | 11/1997 | Ishizaka | 250/559.06 |
| 5,696,383 A | 12/1997 | Cheng | 250/559.22 |
| 5,986,753 A | * 11/1999 | Seelig et al. | 356/244 |
| 6,157,450 A | * 12/2000 | Marchese-Ragona et al. | 356/376 |

* cited by examiner

*Primary Examiner*—Que T. Le
*Assistant Examiner*—Thanh X Luu
(74) *Attorney, Agent, or Firm*—Neal L. Slifkin; Harris Beach LLP

(57) ABSTRACT

In a system for locating and measuring an index mark on an edge of a wafer, a wafer to be examined is positioned and centered on a chuck in a horizontal chuck position such that an index mark is oriented within first and second index mark orientation features disposed on the chuck. The chuck is translatable, tiltable between horizontal and vertical positions, and rotatable over an angle subtended by the index mark orientation features of the chuck. A laser beam from a laser beam optical profiler is focussed on the surface of the wafer at a distance proximate the wafer edge and proximate the first index mark orientation feature of the chuck. The chuck is rotated in a direction from the first to the second index mark orientation feature whereby a reflected portion of the laser beam generates data corresponding to the angular location of index mark edges. An index mark center location is computed. The chuck is tilted to a vertical chuck position, and the index mark is measured by the focussed laser beam to provide index mark data which serve as a basis for accepting or rejecting a wafer.

22 Claims, 8 Drawing Sheets

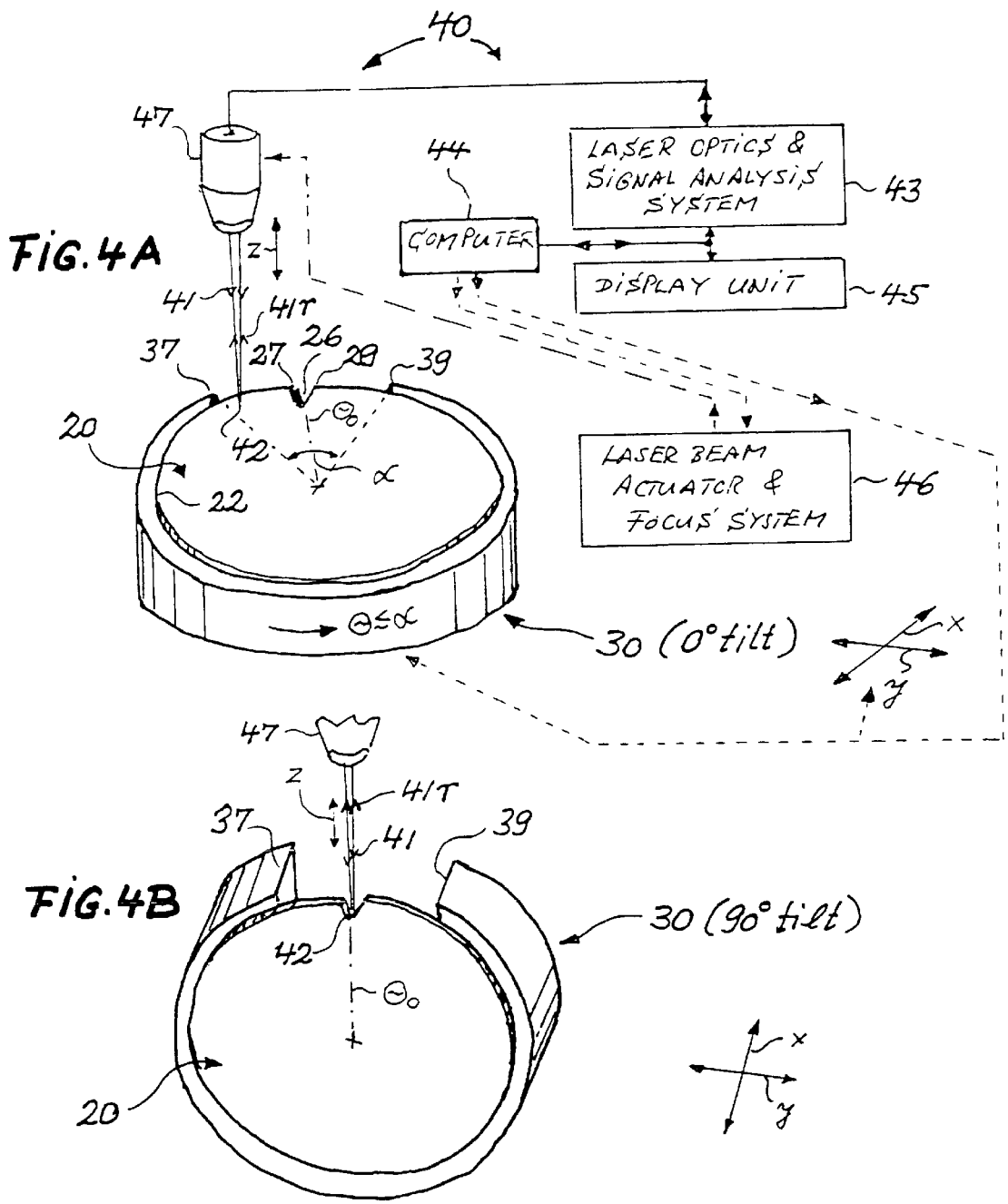

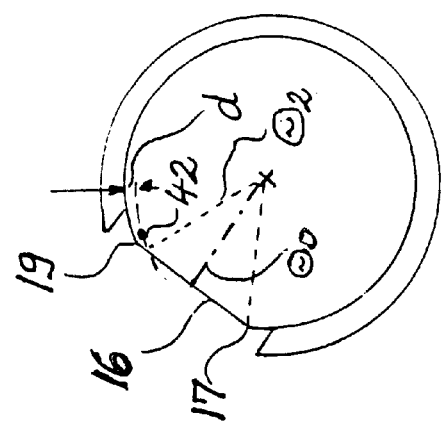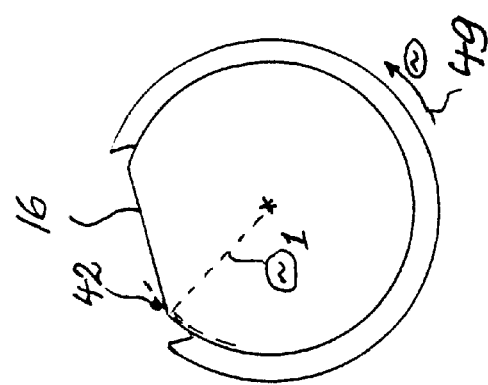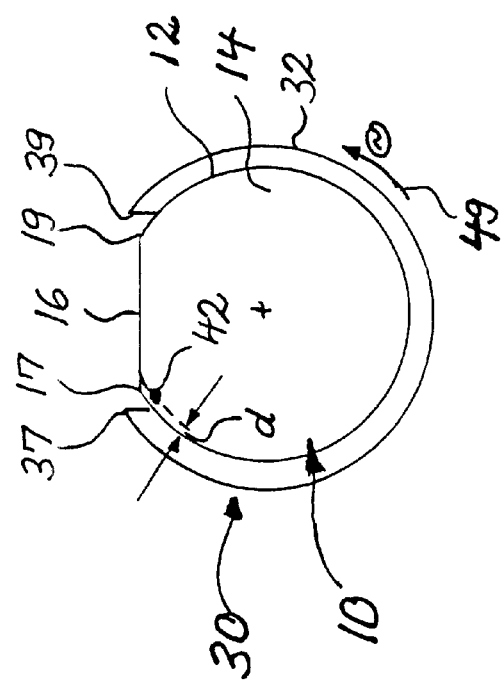

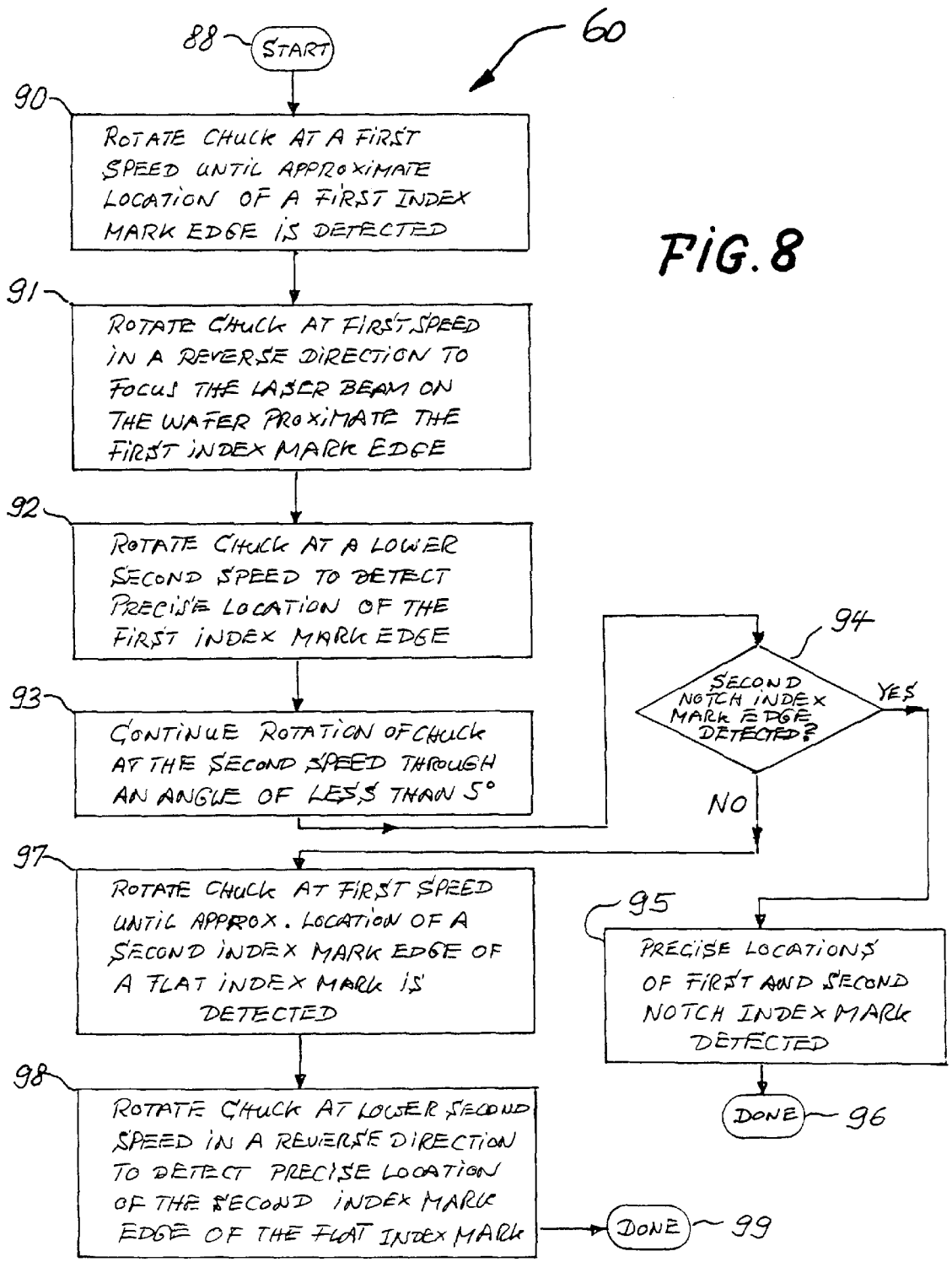

SYSTEM FOR LOCATING AND MEASURING AN INDEX MARK ON AN EDGE OF A WAFER

FIELD OF THE INVENTION

The present invention relates to a system method (and apparatus) for locating and measuring an index mark on an edge of a wafer, and more particularly, to a method of locating an index mark with the wafer positioned in a horizontal position and of measuring the index mark with the wafer in a vertical position.

BACKGROUND OF THE INVENTION

An index mark, such as, for example, a flat or a notch is provided on the edge of a semiconductor wafer by the wafer manufacturer so as to permit reliable and repeatable positioning of wafers in automated semiconductor processing facilities. Typically, one surface and an edge of a wafer, including the index mark, are highly polished. Various methods of finding an index mark along the edge of a wafer are practiced or have been proposed. Such methods include mechanical or opto-mechanical index mark sensing in production equipment, as well as locating an index mark by optical mapping of a wafer edge during rotation of the wafer as, for example, proposed by Cheng in U.S. Pat. No. 5,546,179. The method disclosed by Cheng requires the mapping of the entire edge or periphery of a wafer in order to locate an index mark by rotating the wafer fully 360° while the wafer surface near the edge of the wafer is interrogated by a focussed beam of electromagnetic radiation. While the method proposed by Cheng is capable of determining the height of a wafer as well as the reflectivity of the wafer surface, this method appears to preclude the measurement of an index mark in which the beam emitted by the sensor device would be directed and focussed at the index mark across a thickness dimension of the wafer.

In order to enhance the throughput of wafers in a wafer testing facility, it is desirable to minimize the time required for locating an index mark, and it is considered important to measure directly the optical properties of an index mark so as to ascertain which wafers to accept or to reject on the basis of a degree of optical reflectivity and the uniformity thereof of an index mark.

SUMMARY OF THE INVENTION

It is an object of the present invention to provide a system for locating an index mark on the edge of a wafer with the wafer in a horizontal position, and to measure the index mark with the wafer in a vertical position.

It is another object of the present invention to provide a system for locating an index mark on the edge of a wafer by rotating the wafer through an angle of less than 60°.

An advantage of the system of the present invention is that the time is minimized for locating two edges of an index mark and for computing an index mark center position.

Another advantage of the system of the invention is that the center location of the index mark as well as other locations within the index mark can be readily measured upon tilting the wafer into a vertical position.

A still further advantage of the method of the present invention is that locating an index mark on the edge of a wafer by rotating the wafer through a limited rotational angle obviates the requirement for edge correction due to eccentricity between a wafer center and a center of a chuck on which the wafer is supported.

Briefly described, in a system for locating and measuring an index mark on an edge of a wafer, in accordance with the present invention, a wafer to be examined is positioned and centered on a chuck in a horizontal chuck position such that an index mark is oriented within a first and second index mark orientation feature disposed on the chuck. The chuck is translatable, tiltable between horizontal and vertical positions, and rotatable over an angle subtended by the first and second index mark orientation features of the chuck. A laser beam from a laser beam optical profiler is focussed on the surface of the wafer at a distance proximate the wafer edge and proximate the first index mark orientation feature of the chuck.

The chuck is rotated in a direction from the first to the second orientation feature through an angle of less than 60° whereby a reflected portion of the laser beam generates data corresponding to the angular locations of index mark edges. An index mark center location is computed. The chuck is then tilted to a vertical chuck position, and the index mark is measured by the focussed laser beam to provide index mark data which serve as a basis for accepting or rejecting a wafer.

The foregoing and other features, objects and advantages of the invention as well as presently preferred embodiments thereof will become more apparent from a reading of the following detailed description in connection with the accompanying drawings.

BRIEF DESCRIPTION OF THE DRAWINGS

FIG. 4A is a schematic perspective view showing a wafer having a notch index mark in a horizontal position on the chuck of FIG. 2A with the index mark positioned within the chuck aperture, a focussed laser beam from a laser beam optical profiler incident on a wafer surface proximate a wafer edge and proximate a first corner of the chuck aperture, and showing electronic and optical control elements for translating and rotating the chuck as well as for focussing the laser beam and for generating data corresponding to a reflected portion of the laser beam;

FIG. 4B is a schematic perspective view showing the wafer of FIG. 4A with the chuck tilted into a vertical position (90° tilt) and the laser beam focussed for measuring the index mark at an index mark center location thereof;

FIGS. 5A, 5B, and 5C indicate a rotational sequence in schematic plan view of the chuck and wafer supported thereon as shown in FIG. 3A wherein a focussed laser beam spot effectively generates data corresponding to the intersection between the laser beam and edges of the index mark as the chuck is rotated from one edge to another edge of the chuck aperture, whereby the angular locations of these intersections are used to compute an index mark center location;

FIG. 8 is a flow diagram depicting a presently preferred sequence of rotating steps in locating the edges of an index mark, the steps including rotations at a first speed to find the approximate locations of index mark edges, and rotations at a lower second speed to determine the precise location of index mark edges.

DESCRIPTION OF THE PREFERRED EMBODIMENTS

Figure 1B:
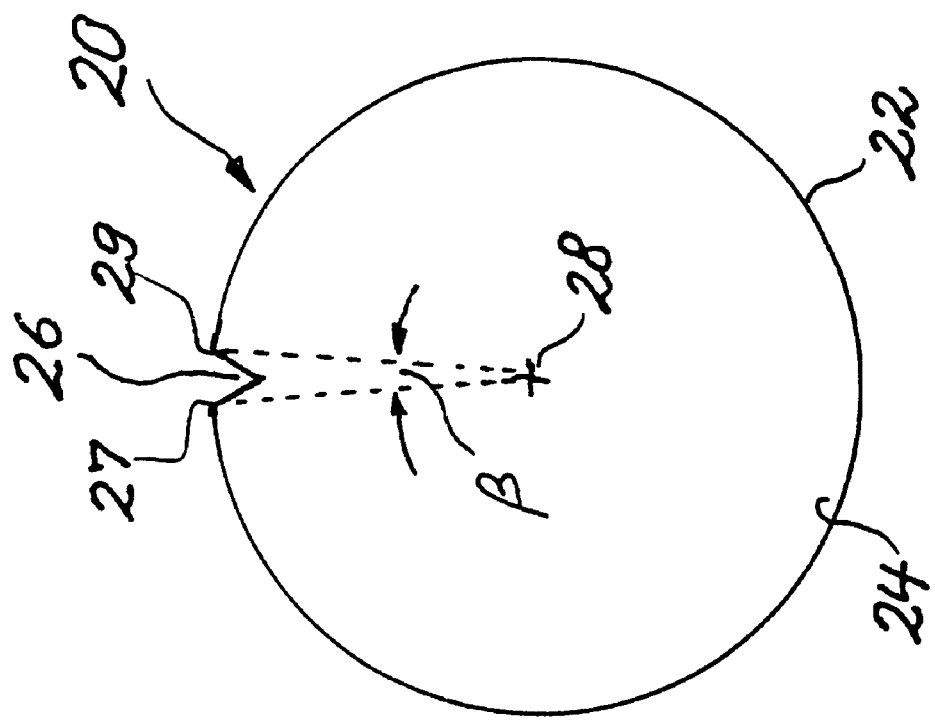
FIG. 1B is a schematic plan view of a wafer having an index mark referred to as a notch.
Figure 1A:
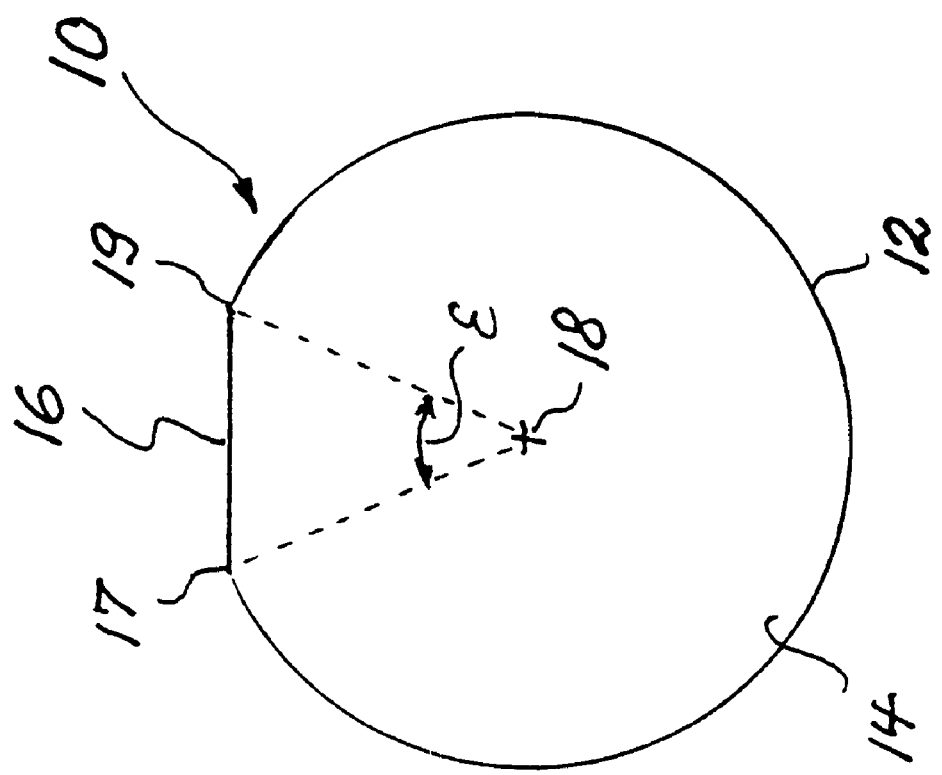
FIG. 1A is a schematic plan view of a wafer having an index mark referred to as a flat.

FIG. 1A is a schematic plan view of a wafer 10 which has an edge 12 and a surface 14. A portion of the wafer edge 12 forms an index mark 16, also referred to as a flat, and defined by index mark edges 17 and 19 forming a subtended angle ε with respect to a wafer center 18, as schematically shown in dotted outline. The wafer 10 can be a semiconductor wafer, such as a silicon wafer or a gallium arsenide wafer, or the wafer can be a glass wafer, quartz wafer, ceramic wafer, or a metal wafer. The subtended angle ε is typically in a range between 34–36°.

FIG. 1B is a schematic plan view of a wafer 20 having an edge 22 and a surface 24. An index mark 26 is defined by index mark edges 27 and 29 on a portion of the edge 22. This index mark 26 is referred to as a notch. The index mark edges 27 and 29 form a subtended angle β with respect to a wafer center 28, as schematically indicated in dotted outline. The wafer 20 can be constructed of one of the materials indicated with reference to FIG. 1A. The subtended angle β is typically in a range of about 1° to about 3° for the notch index mark 26.

Figure 2A:
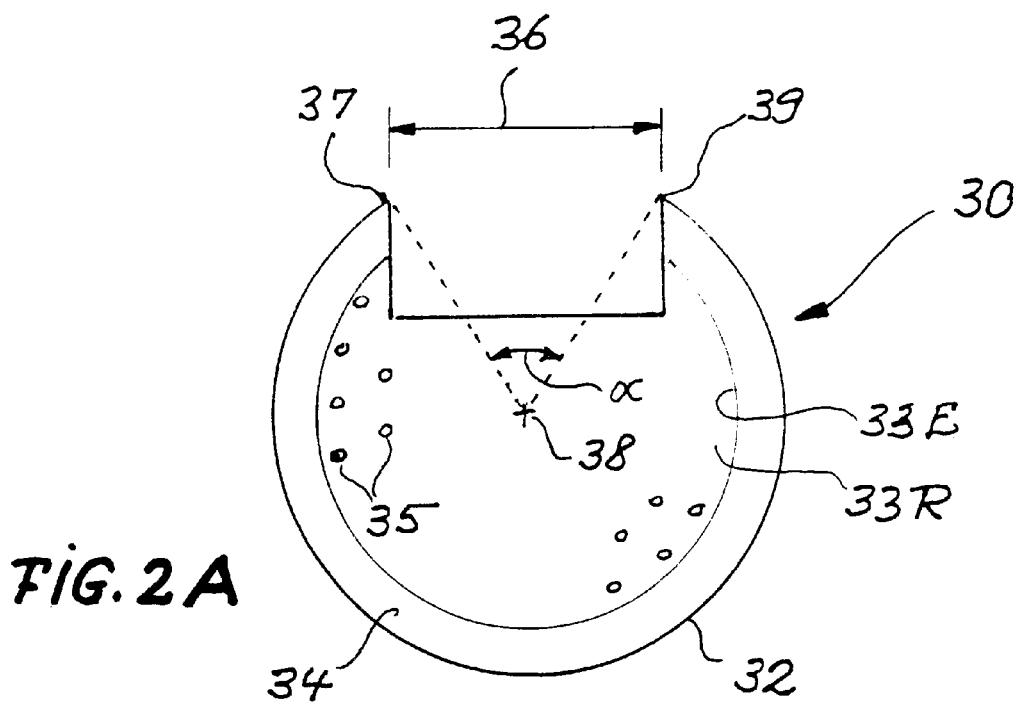
FIG. 2A is a schematic plan view of a pneumatic chuck having an aperture extending inwardly from a chuck edge, and having a wafer-centering recess.

Turning now to FIG. 2A, a schematic plan view shows a chuck 30 having a chuck edge 32 and a chuck surface 34, and the chuck 30 has an aperture 36 which extends inwardly from the chuck edge 32, and defined by aperture corners 37 and 39 which form a subtended aperture angle α with respect to a chuck center 38 as indicated in dotted outline. The chuck 30 is shown having a shallow recess area 33R for accepting a wafer in a substantially centered position, the recess area 33R defined by a recess edge 33E on the chuck surface 34. Pneumatic ports 35 are shown for illustrative purposes only. These ports will draw a wafer on its back side against the chuck surface 34 within the recess area 33R.

Figure 2B:
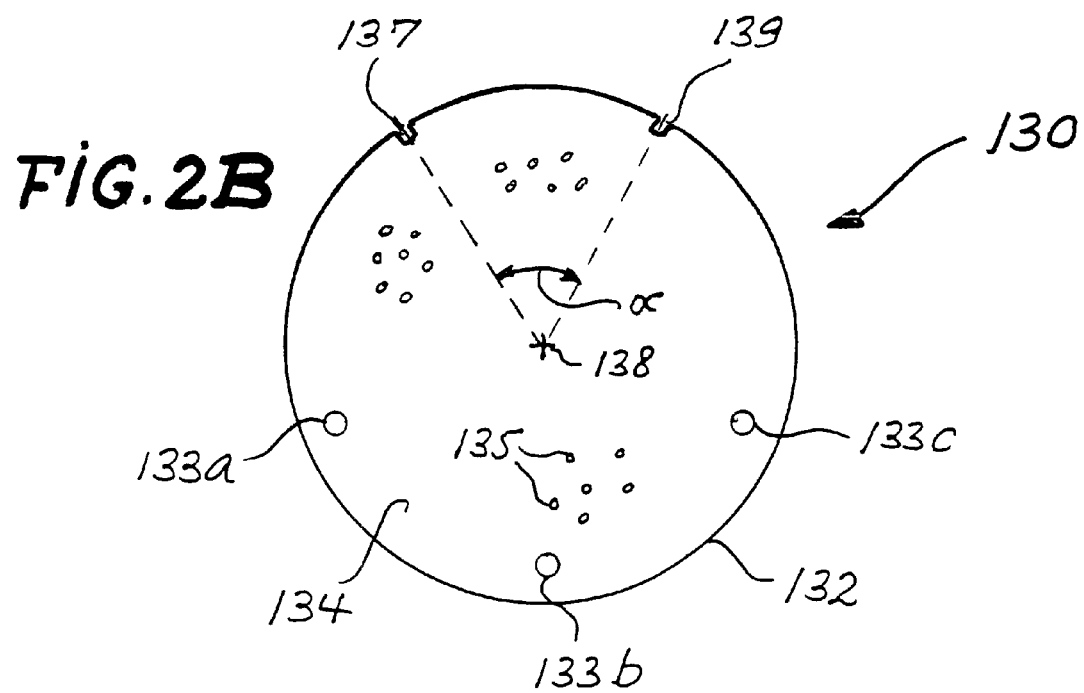
FIG. 2B is a schematic plan view of a pneumatic chuck having index mark orientation indentations formed on a chuck edge, and having wafer-centering stubs projecting from a chuck surface.

In FIG. 2B a schematic plan view of an alternative embodiment of a chuck 130 is shown which is useful in the practice of the invention. The chuck 130 has a chuck edge 132 and a chuck surface 134. In place of the wafer-centering recess 33R of the previously described chuck 30, the chuck 130 has wafer-centering elements 133a, 133b, and 133c which can be pins or stubs extending from the chuck surface 134, as indicated schematically in FIG. 2B. Alternatively, the wafer-centering elements can be in the form of brackets or cleats affixed to the chuck edge 132 and extending inwardly therefrom by a specified distance along the chuck surface 134. The chuck 130 further has index mark orientation features 137 and 139, depicted here as indentations in the chuck edge 132. It will be appreciated that the index mark orientation features can be disposed on the chuck surface 134, or the features can extend from the chuck edge 132 a distance inwardly from the edge along the surface. The index mark orientation features 137 and 139 form a subtended angle α with respect to a chuck center 138 as indicated in dotted outline. Pneumatic ports 135 are shown for illustrative purposes only. These ports will draw a wafer on its back side against the chuck surface 134 when a wafer is centered on the surface.

Figure 3A:
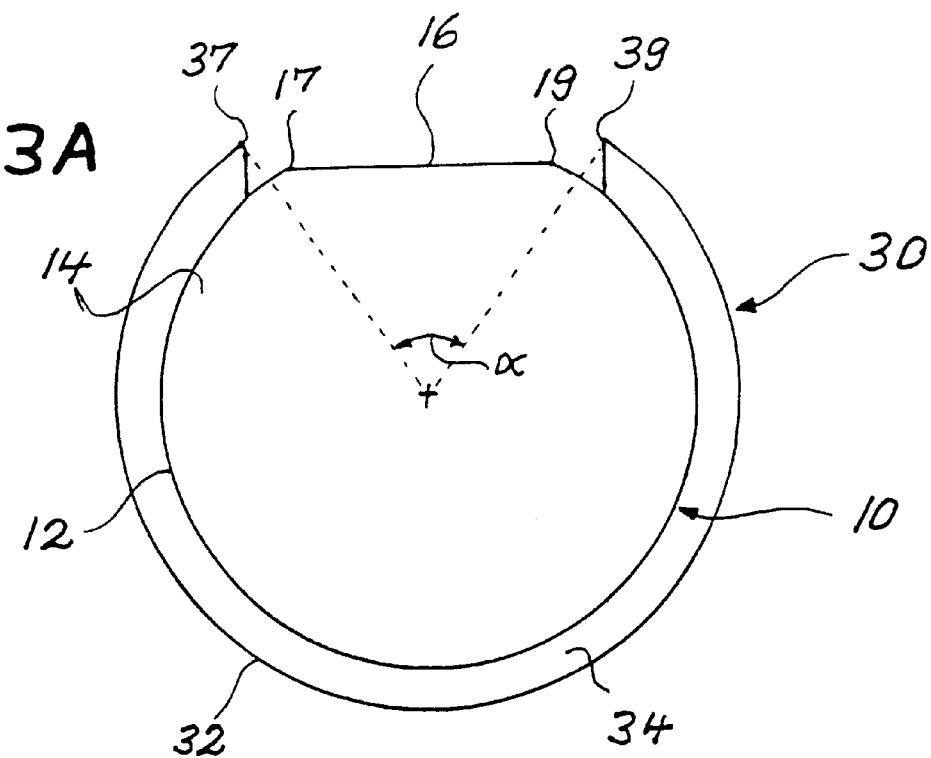
FIG. 3A is a schematic plan view of a wafer depicted in FIG. 1A positioned and centered on the chuck of FIG. 2A such that the index mark (the flat) is oriented within the edges of the aperture of the chuck.

Referring to FIG. 3A, a schematic plan view of a wafer 10 positioned and centered on the chuck 30 of FIG. 2A is shown wherein the index mark edges 17 and 19 of the index mark 16 (the flat) are shown oriented within the chuck aperture defined by aperture corners 37 and 39. The wafer 10 and the chuck 30 have features previously described with respect to FIG. 1A and FIG. 2. The wafer 10 can be positioned manually by an operator on the chuck 30 and oriented so that the index mark 16 (the flat) is oriented within the chuck aperture corners 37 and 39. Alternatively, a robotic arm adapted to pre-orient the index mark 16, can be used to position the wafer 10 on the chuck 30 to mate with the chuck recess area 33R previously described.

Figure 3B:
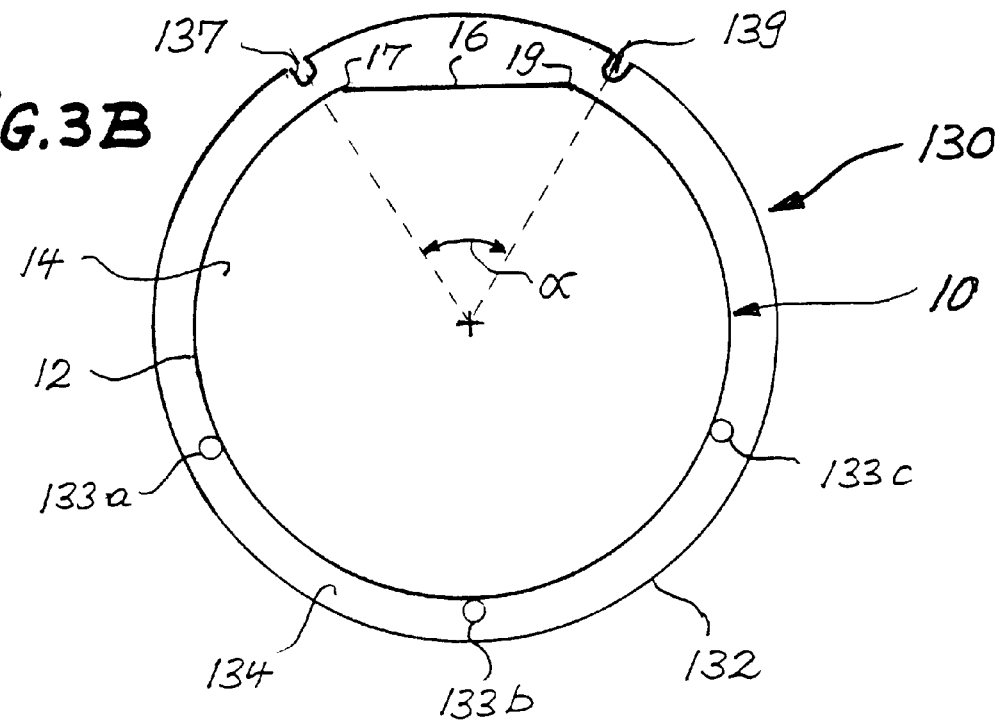
FIG. 3B is a schematic plan view of a wafer depicted in FIG. 1A positioned and centered on the chuck of FIG. 2B such that the index mark (the flat) is oriented within the index mark orientation indentations of the chuck.

In FIG. 3B a wafer 10 is shown positioned on the chuck of FIG. 2B and centered on the chuck surface 134 by contact between the wafer edge 12 with each one of the wafer-centering elements 133a, 133b, and 133c. The wafer 10 is positioned on the chuck 130 such that the index mark edges 17 and 19 of the index mark 16 (the flat) are oriented within the index mark orientation features 137 and 139, i.e. oriented within the angle α subtended by these features.

FIG. 4A is a schematic perspective view of a wafer 20 positioned and oriented on a chuck 30 such that a notch index mark 26 is located within chuck aperture corners 37 and 39. The chuck 30 is translatable in orthogonal x and y directions, and is rotatable through an angle θ which is equal to or smaller than the angle α subtended by the chuck aperture corners 37 and 39. The chuck 30 is also tiltable between a substantially horizontal chuck position, i.e. at 0° tilt, and a substantially vertical chuck position, i.e. at 90° tilt (see FIG. 4B). It will be appreciated that a wafer 10 can be positioned and oriented such that a flat index mark 16 is located within the chuck aperture corners 37 and 39.

Similarly, a wafer 10 or a wafer 20 can be positioned and oriented on the chuck 130 as shown in FIG. 3B, with chuck 130 being translatable, rotatable, and tiltable as described above with reference to FIG. 4A.

It will be appreciated that a wafer processing facility or a wafer testing facility may be called upon to process or to test numerous lots of wafers having one particular diameter, for example, a diameter of 150 mm, followed by wafer lots of wafers having another particular diameter, for example a diameter of 200 mm. In order to locate and to measure an index mark on an edge of wafers having different wafer diameters, a chuck 30 or a chuck 130 has to be selected to permit wafer positioning, wafer centering, and wafer orienting thereon.

Devices and device assemblies for translating and rotating a chuck or platform by stepper motors are well known in the art of robotic design, and such devices and assemblies have been omitted from the drawings for purposes of clarity. The invention requires translating, rotating, and tilting a chuck and a wafer positioned thereon.

A laser beam optical profiler, designated at 40, has a profiler head 47 which projects a laser beam 41 into a focussed spot 42 onto the surface of the wafer 20. The focussed spot 42 of the laser beam 41 may be focussed to a dimension of about 1 micrometer. A reflected portion 41r of the laser beam 41, reflected off the wafer surface, is collected by the head 47, measured in a laser optics and signal analysis system 43, and provided as input to a computer 44 to generate data corresponding to the reflected portion 41r of the laser beam 41. Such data can be displayed in a display unit 45 which may be a computer display terminal or a computer output printer. A laser beam actuator and focus system 46 receives input from the computer 44 and provides actuator and focus control signals to the head 47 via a connection shown in dashed outline and not otherwise identified. The system 46 provides a focus control signal to the head 47 such that the head is moved in a z-direction to maintain the focus of the focussed spot 42 on the wafer surface. As indicated in dashed outline, the computer 44 also provides translation and rotation control signals to affect translating the chuck in x and y directions, and to effect rotating the chuck 30, in response to commands issued by the computer 44. Alternatively, the head 47 may be translated instead of translating the chuck. Translation of the chuck with respect to the head is accomplished in either case.

In the horizontal chuck position shown in FIG. 4A, the chuck 30 and the wafer 20 thereon is translated such that the focussed spot 42 of the laser beam 41 is initially located proximate the wafer edge 22 and proximate a first aperture corner 37 of the chuck. The chuck is then rotated in a direction from the first aperture corner 37 to the second aperture corner 39, whereby the focussed spot 42 intercepts the index mark edges 27 and 29 of the notch index mark 26. As the focussed laser spot 42 intercepts these index mark edges, the reflected portion 41r of the laser beam will decrease substantially, thereby generating data in the analysis system 43 and in computer 44 corresponding to the angular position of the index mark edges 27 and 29. From these angular edge positions the computer 44 computes an angular position $\theta_0$ which corresponds to the center of the index mark 26. The index mark center location data are stored in the computer. The chuck is then rotated in a reverse direction to the angular index mark center position.

Referring now to FIG. 4B, the chuck 30 and the wafer 20 thereon is tilted to a vertical position (90° tilt), and the chuck is translated in that position under computer control with respect to the head 47 until a focussed laser beam spot 42 is obtained at the computed index mark center location $\theta_0$ to measure the index mark at that location for determining the degree of surface finish or the degree of surface polishing present at that location within the index mark. The chuck can then be incrementally translated, for example, in a y-direction to probe the reflective properties of the index mark in several locations thereof.

Analogously, the angular positions of index mark edges 17 and 19 of a wafer 10, or the index mark edges 27 and 29 of a wafer 20, and respectively computed index mark angular center positions $\theta_0$ are determined when a wafer is positioned, centered, and oriented on a chuck 130, such as shown in FIG. 3B. The chuck 130 is then tilted into a vertical position for measurement of the index mark, as previously described with reference to FIG. 4B.

Turning now to FIGS. 5A, 5B, and 5C, there is depicted in schematic plan views a sequence of chuck rotating steps of a chuck 30 having a wafer 10 supported thereon in a horizontal chuck position (0° tilt) used for locating an index mark 16 and for determining a computed angular center position $\theta_0$ thereof.

In FIG. 5A the chuck 30 has been translated such that a focussed laser beam spot 42 is incident on the wafer surface 14 at a position proximate a first aperture corner 37 of the chuck 30 and is spaced inwardly from the wafer edge 12 by a distance d which can be in a range of 0.1 to 0.9 of a depth dimension of a notch index mark, and which is preferably less than 0.5 mm. Rotating the chuck 30 now commences in a direction indicated by the arrow 49 until the focussed laser spot 42 intercepts a portion of the index mark 16 proximate a first index mark edge 17, resulting in a substantial decrease of the reflected portion 41r collected by the head 47 (see FIG. 4A) and thus providing data corresponding to the angular location $\theta_1$ of the intercept between the laser spot 42 and a first index mark location as shown in FIG. 5B. Rotating the wafer continues until a second index mark location $\theta_2$ is found (see FIG. 5C). An angular center location $\theta_0$ of the index mark 16 is then computed and corresponding data are stored in computer 44. The rotation configuration of FIG. 5C is then returned to the computed index mark center location by rotating the chuck 30 in a reverse direction in the absence of the laser beam 41, and the chuck is then tilted into a vertical position (90° tilt) to commence with measuring the reflective data corresponding to reflective properties of the edge of the index mark 16, first at the computed center location $\theta_0$, and subsequently by incremental translation of the chuck with respect to the head 47 at additional locations along the index mark as described previously with reference to FIGS. 4A and 4B.

Considering the angles subtended by the flat of an index mark (approximately 35°) and by the notch of an index mark (approximately 1° to 3°) it will be apparent that the process of locating an index mark in the horizontal chuck position will result in data which reliably distinguish between these two types of index marks on the edge of a wafer. In order to accommodate the approximate orientation of an index mark within the aperture 36 of the chuck 30, defined by aperture corners 37 and 39 (see FIG. 2A) the angle α subtended by these aperture corners is preferably about 60°, and the chuck 30 will be rotated through an angle of less than 60° in locating the edges of an index mark. Similarly, the index mark orientation features 137 and 139 of the chuck 130 (see FIG. 2B) subtend an angle α with respect to the chuck center 138 which is preferably about 60°, and the chuck 130 will be rotated through an angle of less than 60° in locating the edges of an index mark.

Figure 6:
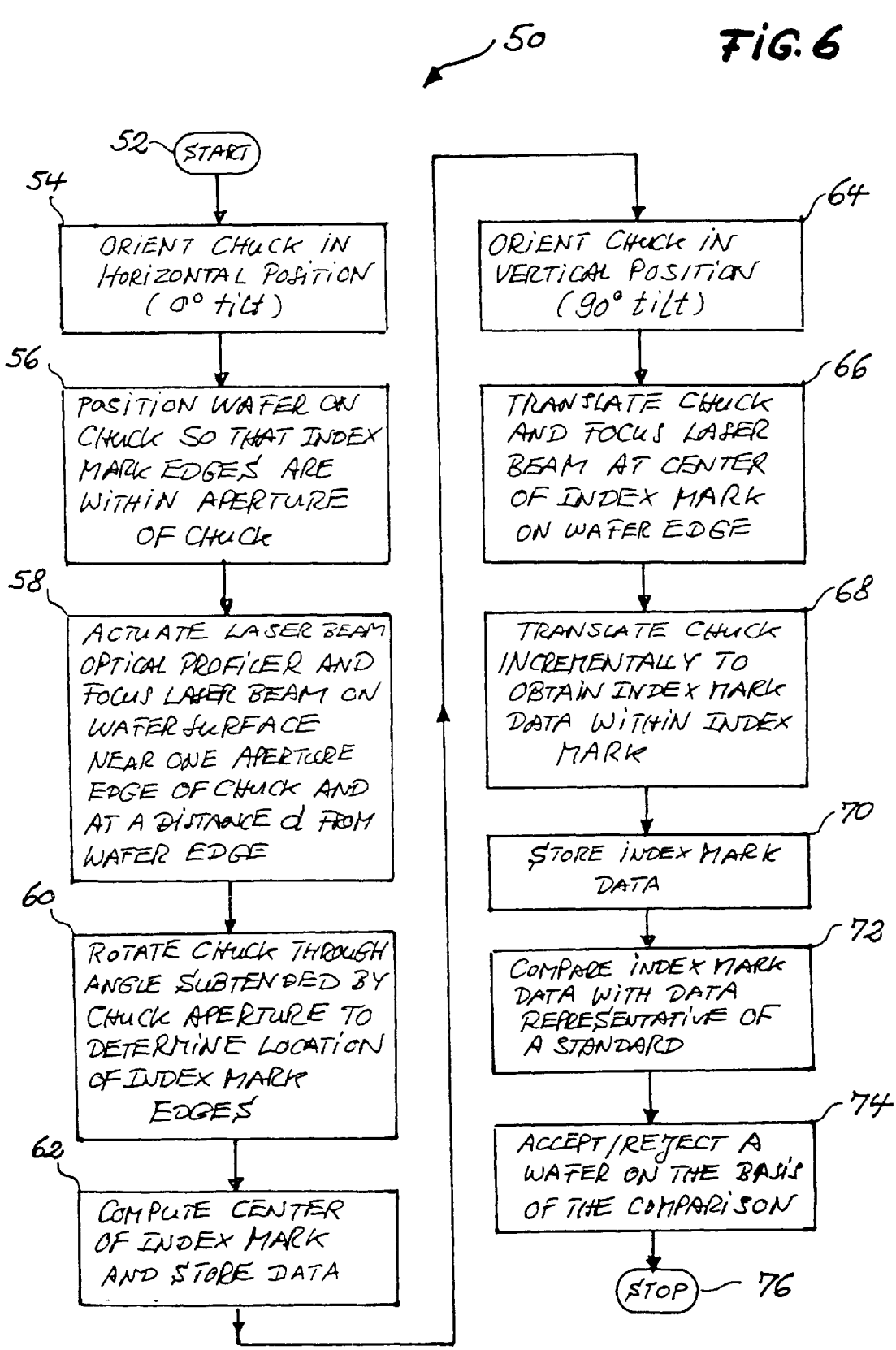
FIG. 6 is a flow diagram showing the steps of locating an index mark with the chuck supporting a wafer in a horizontal chuck position, and the steps of measuring index mark data within an index mark with the chuck and wafer in a vertical position.

Turning to FIG. 6, a process 50, carried out with the aid of a computer 44, delineates the steps of locating an index mark on the edge of a wafer in a horizontal chuck position, and of measuring index mark data in a vertical chuck position in order to accept or to reject a wafer based on reflective properties within an index mark.

The process starts at step 52. In step 54 the chuck is tilted in a horizontal (0° tilt) position; in step 56 a wafer is positioned on the chuck so that index mark edges of an index mark of the wafer are positioned within an aperture of the chuck; in step 58 a laser beam optical profiler is actuated and focusses a laser beam on the surface of the wafer near or proximate one aperture edge of the chuck and at a distance d from the wafer edge; in step 60 the chuck is rotated through an angle smaller than an angle subtended by the chuck aperture to determine the location of index mark edges; in step 62 the center of an index mark is computed from the angular locations of the index mark edges and the computed data are stored; in step 64 the chuck is oriented in a vertical position (90° tilt); in step 66 the chuck is translated with respect to a profiler head of an optical profiler and a laser beam from an optical profiler is focussed at the computed center of the index mark to obtain index mark center data; in step 68 the chuck is translated incrementally with respect to the profiler head to obtain additional index mark data corresponding to locations within the index mark; in step 70 these index mark data are stored in a computer; in step 72 the measured index mark data are compared to data representative of the reflective properties of an acceptable index mark standard, the comparison of data being provided by a computer; in step 74 a decision is made to accept or to reject a wafer on the basis of the index mark comparison; and in step 76 the process sequence is terminated.

The step 72 of comparing the measured index mark data with data representative of the reflective properties of an acceptable index mark, and the decision step 74 of accepting or rejecting a wafer are important steps because the degree of polish or the degree of surface finish of an index mark is frequently not comparable to the degree of finish of the surface of a wafer.

Figure 7:
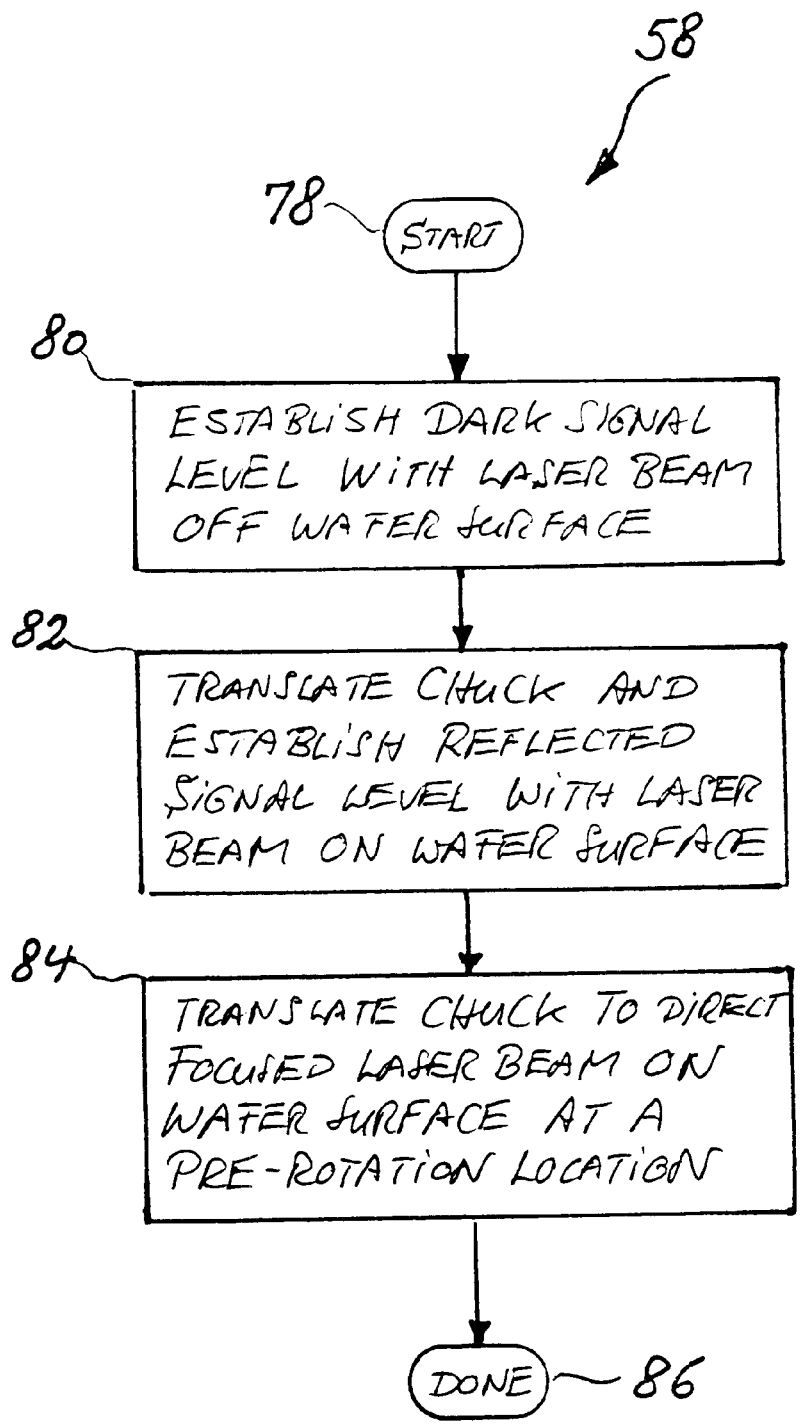
FIG. 7 is a flow diagram indicating steps of establishing a dark signal level, a reflected signal level, and a translating step to position the wafer on the chuck at a pre-rotation location.

Turning to FIG. 7, the process step 58 is further detailed. At a step 78 a sequence of three steps is started; at a step 80 a dark signal level is established by directing the laser beam from the optical profiler head 47 (see FIG. 4A) to a position off the wafer surface so that no reflected portion 41r of the laser beam is received by the head 47; in step 82 the chuck (with the wafer thereon) is translated with respect to the profiler head and a reflected signal level is established with the laser beam 41 focussed on the wafer surface as a spot 42 such as shown schematically in FIG. 4A; in a step 84 the chuck 30 is translated further to direct the focussed spot 42 of the laser beam on the wafer surface at a pre-rotational location such as previously described with reference to FIGS. 4A and 5A; and step 86 terminates this process sequence.

FIG. 8 is a schematic flow chart describing preferred process steps of the chuck rotating step 60 of FIG. 6. The process starts at step 88; in step 90 the chuck is rotated at a first rotational speed until an approximate location of a first index mark edge is detected. The first rotational speed is relatively fast and is preferably in a range of 20–80°/sec.

In step 91 the chuck is rotated at the first rotational speed in a reverse direction until the reflected portion 41r of the laser beam 41 generates data indicating that the laser beam is again focussed into the spot 42 (see FIG. 4A) on the wafer surface at a location proximate the first index mark edge of the wafer.

In step 92 the chuck is rotated in a direction from the first to the second aperture corner at a lower second rotational speed to detect a precise angular location of the first index mark edge. This lower second rotational speed is preferably in a range of 0.5–5°/sec.

In step 93 rotation of the chuck at the lower second rotational speed is continued through an angle of less than 5°beyond the precise angular location of the first index mark edge to allow for a possible detection of a precise angular location of a second index mark edge within an angle of about 3° from the first index mark edge, such angle of about 3° being subtended by a notch index mark with respect to a wafer center.

In step 94, if a second notch index mark edge has been detected, the precise angular locations of first and second notch index mark edges will have been determined in step 95, and the sequence of rotating steps are done at step 96.

If a second notch index mark edge was not found in step 94, the chuck is rotated in a direction toward the second aperture corner of the chuck at the first rotational speed in a step 97 until an approximate location of a second index mark edge of a flat index mark is detected.

In step 98 the chuck is rotated at the lower second rotational speed, and in a reverse direction, to detect the precise angular location of the second index mark edge of the flat index mark.

In step 99 this particular sequence of rotating steps 97 and 98 is completed.

The optical profiler 40 is preferably a laser phase differential profiler such as used in a wafer surface profiler commercially available from Chapman Instruments of Rochester, N.Y. as a model MP 3000.

From the foregoing description it will be apparent that there has been provided a method of locating and measuring an index mark on the edge of a wafer. Variations and modifications in practicing the method of the invention will undoubtedly suggest themselves to those skilled in the art. Accordingly, the foregoing description should be taken as illustrative and not in a limiting sense.

What is claimed is:

1. A method of locating and measuring an index mark on an edge of a wafer, comprising the steps of:

a) providing a laser beam optical profiler adapted to focus an incident laser beam at a spot on a surface of a wafer and to receive a reflected portion of said incident laser beam therefrom for generating data from which a center of an index mark can be computed;

b) providing a chuck for accepting and centering a wafer, said chuck being translatable with respect to said optical profiler in respectively orthogonal x and y directions, and said chuck being tiltable between a first chuck position and a second chuck position, characterized in that said chuck has a first and a second index mark orientation feature extending inwardly from an edge of said chuck, and said chuck being rotatable at least through an angle subtended by said first and second index mark orientation features;

c) positioning a wafer having an index mark on an edge thereof on said chuck in said first chuck position such that said index mark is oriented between said first and second index mark orientation features;

d) translating said chuck with respect to said optical profiler such that said incident laser beam is focussed at said spot at a distance proximate said edge of said wafer and proximate said first index mark orientation feature of said chuck;

e) rotating said chuck in a direction from said first index mark orientation feature toward said second index mark orientation feature such that said focussed beam is translated circumferentially at a fixed radius along said wafer surface to intercept sequentially said first edge and said second edge of said index mark, the amplitude of said reflected portion being changed thereby and said change being detected, whereby said reflected portion generates data corresponding to the angular locations of a first edge and a second edge of said index mark;

f) computing the angular location of the center of said index mark from said corresponding data, and storing said computed index mark center location;

g) tilting said chuck to a second position orthogonal to said first position;

h) translating said chuck with respect to said optical profiler such that said incident laser beam from said optical profiler is focused on said wafer edge at said computed index mark center location for measuring data corresponding to said center of said index mark;

i) translating said chuck with respect to said profiler for measuring data corresponding to a plurality of locations along said index mark edge; and j) comparing said index mark data with data representative of a standard to determine acceptability of said wafer.

2. The method as recited in claim 1 wherein the translating step (d) includes translating the chuck such that the laser beam is focussed on the surface of the wafer at a distance less than 0.5 mm inwardly from the edge of the wafer.

3. The method as recited in claim 1 wherein the rotating step (e) includes the steps of:

(m) rotating the chuck at a first rotational speed in a direction from the first index mark orientation feature to the second index mark orientation feature until the reflected portion of the laser beam generates data corresponding to an approximate angular location of a first edge of an index mark;

(n) rotating the chuck at the first rotational speed and in a reverse direction toward the first index mark orientation feature until the reflected portion of the laser beam indicates that the laser beam is focussed on the wafer surface;

(o) rotating the chuck at a lower second rotational speed in a direction from the first to the second index mark orientation feature to generate data corresponding to a precise angular location of the first edge of the index mark;

(p) continuing rotating the chuck at the lower second rotational speed through an angle of less than 5° beyond the precise angular location of the first edge of the index mark to generate data corresponding to a precise angular location of a second edge of the index mark if the index mark is a notch index mark;

(q) continuing rotating the chuck at the first rotational speed in a direction toward the second index mark orientation feature if a second edge of a notch index mark was not found in step (p) until the reflected portion of the laser beam generates data corresponding to an approximate angular location of a second edge of the index mark, thereby indicating that the index mark is a flat; and (r) rotating the chuck at a lower second rotational speed and in a reverse direction toward the first index mark orientation feature until the reflected portion of the laser beam generates data corresponding to a precise angular location of the second edge of the flat index mark.

4. The method as recited in claim 1 wherein the translating step (d) includes a preceding step of establishing a dark signal level by translating the chuck with respect to the profiler such that the laser beam from the profiler is directed at a chuck surface at a distance spaced outwardly from the edge of the wafer.

5. The method as recited in claim 3 wherein the first rotational speed is in a range of 20–80°/sec, and the second rotational speed is in a range of 0.5–5°/sec.

6. The method as recited in claim 1 wherein the index mark is selected from the group consisting of a flat or a notch.

7. The method as recited in claim 1 wherein the rotating step (e) includes rotating the chuck through an angle of less than 60°.

8. A method of locating and measuring an index mark on an edge of a wafer, comprising the steps of:

a) providing a laser beam optical profiler adapted to focus an incident laser beam at a spot on a surface of a wafer and to receive a reflected portion of said incident laser beam therefrom for generating data from which a center of an index mark can be computed;

b) providing a chuck for accepting and centering a wafer, said chuck being translatable with respect to said optical profiler in respectively orthogonal x and y directions, and said chuck being tiltable between a first chuck position and a second chuck position, characterized in that said chuck has an aperture extending inwardly from an edge of said chuck, said aperture being defined by a first aperture corner and a second aperture corner, and said chuck being rotatable at least through an angle subtended by said first and second aperture corners;

c) positioning a wafer having an index mark on an edge thereof on said chuck, said chuck being in said first chuck position such that said index mark is oriented between said first and second aperture corners;

d) translating said chuck with respect to said optical profiler such that said incident laser beam is focussed at said spot at a distance proximate said edge of said wafer and proximate said first aperture corner of said chuck;

e) rotating said chuck in a direction from said first aperture corner toward said second aperture corner such that said focussed beam is translated circumferentially at a fixed radius along said wafer surface to intercept sequentially said first edge and said second edge of said index mark, the amplitude of said reflected portion being changed thereby and said change being detected, whereby said reflected portion generates data corresponding to the angular locations of a first edge and a second edge of said index mark;

f) computing the angular location of the center of said index mark from said corresponding data, and storing said computed index mark center location;

g) tilting said chuck to a second position orthogonal to said first position;

h) translating said chuck with respect to said optical profiler such that said incident laser beam from said optical profiler is focused on said wafer edge at said computed index mark center location for measuring data corresponding to said center of said index mark;

i) translating said chuck with respect to said profiler for measuring data corresponding to a plurality of locations along said index mark edge; and j) comparing said index mark data with data representative of a standard to determine acceptability of said wafer.

9. The method as recited in claim 8 wherein the translating step (d) includes translating the chuck with respect to the profiler such that the laser beam is focussed on the surface of the wafer at a distance less than 0.5 mm inwardly from the edge of the wafer.

10. The method as recited in claim 8 wherein the rotating step (e) includes the steps of:

(m) rotating the chuck at a first rotational speed in a direction from the first aperture corner to the second aperture corner until the reflected portion of the laser beam generates data corresponding to an approximate angular location of a first edge of an index mark;

(n) rotating the chuck at the first rotational speed and in a reverse direction toward the first aperture corner until the reflected portion of the laser beam indicates that the laser beam is focussed on the wafer surface;

(o) rotating the chuck at a lower second rotational speed in a direction from the first to the second aperture corner to generate data corresponding to a precise angular location of the first edge of the index mark;

(p) continuing rotating the chuck at the lower second rotational speed through an angle of less than 5° beyond the precise angular location of the first edge of the index mark to generate data corresponding to a precise angular location of a second edge of the index mark if the index mark is a notch index mark;

(q) continuing rotating the chuck at the first rotational speed in a direction toward the second aperture corner if a second edge of a notch index mark was not found in step (p) until the reflected portion of the laser beam generates data corresponding to an approximate angular location of a second edge of the index mark, thereby indicating that the index mark is a flat; and (r) rotating the chuck at a lower second rotational speed and in a reverse direction toward the first aperture corner until the reflected portion of the laser beam generates data corresponding to a precise angular location of the second edge of the flat index mark.

11. The method as recited in claim 8 wherein the translating step (d) includes a preceding step of establishing a dark signal level by translating the chuck with respect to the profiler such that the laser beam from the optical profiler is directed at the aperture of the chuck at a distance spaced outwardly from the edge of the wafer.

12. The method as recited in claim 10 wherein the first rotational speed is in a range of 20–80°/sec, and the second rotational speed is in a range of 0.5–5°/sec.

13. The method as recited in claim 8 wherein the index mark is a flat or a notch.

14. The method as recited in claim 8 wherein the rotating step (e) includes rotating the chuck through an angle of less than 60°.

15. A system for locating and measuring an index mark on an edge of a wafer, comprising:

a) a laser beam optical profiler adapted to focus an incident laser beam at a spot on a surface of a wafer and to receive a reflected portion of said incident beam therefrom for generating data from which a center of an index mark may be computed;

b) a chuck for accepting said wafer, said chuck having means for centering said wafer thereon, having first index mark orientation means and second index mark orientation means for orienting said index mark of said wafer therebetween, having means for translating said chuck with respect to said optical profiler in respectively orthogonal x and y directions, having means for tilting said chuck between a first chuck position and a second chuck position orthogonal to said first chuck position, and means for rotating said chuck at least through an angle subtended by said first and second index mark orientation means;

c) means for centering said wafer on said chuck in said first chuck position such that said index mark is oriented between said first and the second index mark orientation means;

d) means for detecting an angular location of a first edge and a second edge of said index mark when said chuck is rotated by said rotating means through said subtended angle such that said focussed beam is translated circumferentially at a fixed radius along said wafer surface to intercept sequentially said first edge and said second edge of said index mark, the amplitude of said reflected portion being changed thereby and said change being detected;

e) means for computing an index mark center location from said detected angular locations of said first and second index mark edges;

f) means for measuring index mark data with said chuck in said second chuck position and said laser focussed on said wafer edge; and g) means for comparing said measured index mark data with data representative of a standard to determine acceptability of said wafer.

16. The apparatus in accordance with claim 15 wherein the laser beam optical profiler is a phase differential laser beam optical profiler.

17. The apparatus in accordance with claim 15 wherein the means for centering a wafer on the chuck includes centering pins or centering stubs projecting from a surface of the chuck, or centering brackets extending inwardly from an edge of the chuck along a chuck surface.

18. The apparatus in accordance with claim 15 wherein the means for centering a wafer on the chuck is a recess in a chuck surface concentric with a chuck edge, the recess configured to accept a wafer.

19. The apparatus in accordance with claim 17 wherein the first and second index mark orientation means are markings on an edge of the chuck or extending on a surface of the chuck by a distance inwardly from the edge of the chuck, the first and second index mark orientation means subtending an angle of about 60°.

20. The apparatus in accordance with claim 17 wherein the first and second index mark orientation means are first and second aperture corners of an aperture which extends inwardly from an edge of the chuck, the first and second aperture corners subtending an angle of about 60°.

21. The apparatus in accordance with claim 18 wherein the first and second index mark orientation means are first and second aperture corners of an aperture which extends inwardly from an edge of the chuck, the first and second aperture corners subtending an angle of about 60°.

22. The apparatus in accordance with claim 15 wherein the means for rotating the chuck includes means for rotating the chuck in a direction from the first to the second index mark orientation means at a first rotational speed in a range of 20–80°/sec to detect an approximate angular location of a first index mark edge; means for rotating the chuck in a reverse direction at the first rotational speed; means for rotating the chuck in a direction from the first to the second index mark orientation means at a lower second rotational speed in a range of 0.5 to 5°/sec to detect a precise angular location of the first index mark edge; means for rotating the chuck at the second rotational speed beyond the precise angular location of the first index mark edge by an angle of less than 5° so as to detect a precise angular location of a second index mark edge of a notch index mark if such index mark is a notch index mark; means for rotating the chuck at the first rotational speed in a direction toward the second index mark orientation means if a notch index mark was not detected to detect an approximate angular location of a second index mark edge associated with a flat index mark; and means for rotating the chuck in a reverse direction at the lower second rotational speed to detect a precise angular location of the second index mark edge.

* * * * *